United States Patent
Daughton et al.

(10) Patent No.: US 6,340,886 B1
(45) Date of Patent: Jan. 22, 2002

(54) MAGNETIC FIELD SENSOR WITH A PLURALITY OF MAGNETORESISTIVE THIN-FILM LAYERS HAVING AN END AT A COMMON SURFACE

(75) Inventors: James M. Daughton, Edina, MN (US); Arthur V. Pohm, Ames, IA (US)

(73) Assignee: Nonvolatile Electronics, Incorporated, Eden Prairie, MN (US)

( * ) Notice: Subject to any disclaimer, the term of this patent is extended or adjusted under 35 U.S.C. 154(b) by 0 days.

(21) Appl. No.: 08/907,561

(22) Filed: Aug. 8, 1997

(51) Int. Cl.⁷ .......................... G01R 33/09; G11B 5/39
(52) U.S. Cl. ...................... 324/252; 360/113
(58) Field of Search ................ 324/252, 207.21, 324/228, 244, 249; 338/32 R; 360/113; 428/212

(56) References Cited

U.S. PATENT DOCUMENTS

| | | | |
|---|---|---|---|
| 4,504,880 A | * 3/1985 | Church et al. | 360/113 |
| 5,366,815 A | * 11/1994 | Araki et al. | 428/611 |
| 5,569,544 A | * 10/1996 | Daughton | 324/252 X |
| 5,617,071 A | * 4/1997 | Daughton | 324/207.1 X |
| 5,750,275 A | * 5/1998 | Katz et al. | 428/694 |

OTHER PUBLICATIONS

Article: "Sensitivity of Orthogonal Magnetoresistive Heads" by Wang et al., *IEEE Transactions on Magnetics*, vol. 29, No. 6, Nov. 1993; pp. 3820–3822.

Article: "Narrow End–On Giant Magnetoresistance READ–Head Sensors" by Pohm et al., *IEEE Transactions on Magnetics*, vol. 33, No. 3, May 1997; pp. 2392–2396.

* cited by examiner

*Primary Examiner*—Josie Ballato
*Assistant Examiner*—T. R. Sundaram
(74) *Attorney, Agent, or Firm*—Kinney & Lange, P.A.

(57) ABSTRACT

A magnetic field sensing structure for sensing magnetic field changes provided therein having a pair of pole structures with a gap space between them that each include permeable material and end in substantially a common surface. A plurality of field sensing structures is positioned successively in the gap space to be supported between the pole structures with each having an end thereof substantially the common surface. These sensing structures are formed of a plurality of magnetoresistive, anisotropic, ferromagnetic thin-film layers at least two of which are separated from one another by a nonmagnetic, electrically conductive layer positioned between them. They are electrically connected to one another adjacent the common surface, and may be electrically connected to one of the pole structures.

11 Claims, 3 Drawing Sheets

MAGNETIC FIELD SENSOR WITH A PLURALITY OF MAGNETORESISTIVE THIN-FILM LAYERS HAVING AN END AT A COMMON SURFACE

BACKGROUND OF THE INVENTION

The present invention relates to ferromagnetic thin-film structures exhibiting relatively large magnetoresistive characteristics and, more particularly, to such structures used to sense externally applied magnetic fields.

Many kinds of electronic systems make use of magnetic devices including both digital systems, such as memories, and analog systems such as field sensors. Magnetometers and other magnetic field sensing devices are used extensively in many kinds of systems including magnetic disk memories and magnetic tape storage systems of various kinds. Such devices provide output signals representing the magnetic field sensed thereby in a variety of situations.

Such sensors can often be advantageously fabricated using ferromagnetic thin-film materials, and are often based on magnetoresistive sensing of magnetic conditions therein. These devices may be provided on a surface of a monolithic integrated circuit chip to provide convenient electrical connections between the device and the operating circuitry therefor in the integrated circuit chip. Otherwise, they may be mounted on another structure conveniently close to the sensor for this purpose.

Ferromagnetic thin-film sensors can be made very small when so constructed. Such sensors are often provided in the form of an intermediate separating material having two major surfaces on each of which an anisotropic ferromagnetic thin-film is provided. In such "sandwich" structures, reducing the thickness of the ferromagnetic thin-films in the intermediate layer has been shown to lead to a "giant magnetoresistive effect" being present. This effect can be enhanced by having additional alternating ones of such films and layers, i.e. superlattices. This effect can yield a magnetoresistive response which can be in the range of up to an order of magnitude greater than that due to the well-known anisotropic magnetoresistive response.

In the ordinary anisotropic magnetoresistive response in ferromagnetic thin-films, varying differences between the direction of the magnetization vector in such a thin-film and the direction of a sensing current passed through that film in turn lead to varying differences in the effective electrical resistance of the film in the direction of the current. The maximum electrical resistance occurs when the magnetization vector in the film and the current direction are parallel to one another, while the minimum resistance occurs when they are perpendicular to one another. The total electrical resistance of such a magnetoresistive ferromagnetic thin-film exhibiting this response can be shown to be given by a constant value, representing the minimum resistance present, plus an additional value depending on the angle between the current direction in the film and the magnetization vector therein. This additional resistance follows a square of the cosine of that angle.

As a result, external magnetic fields supplied for operating a film sensor of this sort can be used to vary the angle of the magnetization vector in such a film portion with respect to the easy axis of that film portion. This axis exists in the film because of an anisotropy present therein typically resulting from depositing the film in the presence of an externally supplied magnetic field during deposition of the film that is oriented in the plane of the film along the direction desired for the easy axis in the resulting film.

During subsequent operation of a sensing device using this resulting film, such externally supplied magnetic fields for operating the film sensor can vary the magnetization vector angle to such an extent as to cause switching of that film's magnetization vector between two stable states which occur as magnetizations oriented in opposite directions along the established easy axis. The state of the magnetization vector in such a film portion can be measured, or sensed, by the change in resistance encountered by a current directed through this film portion.

In contrast to this arrangement, resistance in the plane of either of the ferromagnetic thin-films in the "sandwich" structure is isotropic with respect to the giant magnetoresistive effect rather than depending on the direction of a sensing current therethrough as for the anisotropic magnetoresistive effect. The giant magnetoresistive effect has a magnetization dependent component to resistance that varies as the cosine of the angle between the magnetizations in the two ferromagnetic thin-films on either side of the intermediate layer. In the giant magnetoresistive effect, the electrical resistance through the "sandwich" or superlattice is lower if the magnetizations in the two separated ferromagnetic thin-films are parallel than it is if these magnetizations are antiparallel, i.e. oriented in opposing directions. Further, the anisotropic magnetoresistive effect in very thin films is considerably reduced from the bulk values therefor in thicker films due to surface scattering, whereas very thin films are a fundamental requirement to obtain a significant giant magnetoresistive effect. The total electrical resistance in such a magnetoresistive ferromagnetic thin-film "sandwich" structure can be shown again to be given by a constant value, representing the minimum resistance present, plus an additional value depending on the angle between the magnetization vectors and the two films as indicated above.

One common magnetic field sensing situation is the sensing of magnetization changes along a data recording track selected from many such tracks in the magnetic media of a magnetic data storage system. As these tracks are made narrower and narrower to permit increases in the data density in the magnetic media, inductive sensing of the magnetization changes along any of those tracks becomes less feasible. The smaller magnetization volumes lead to smaller outputs from an inductive sensor, and there is a limit to the number of turns in the coil used in such a sensor which can be provided to increase the output signal. Even in thin-film versions thereof, such inductive sensing structures remain relatively thick which becomes a problem as the tracks are made more narrow. Thus, sensing of the magnetization changes along the track using thin-film magnetoresistive sensors has become attractive.

Such magnetoresistive sensors for detecting magnetization changes along a track in the magnetic media are typically formed with the magnetoresistive sensor film in a rectangular shape, and sensors based on such films in initial designs therefor had such a sensing film positioned between a pair of highly permeable magnetic material shielding poles with a long side of the film's rectangular shape located adjacent the magnetic media to result in what is oftentimes termed a horizontal sensor. More recently, such magnetoresistive sensors have had an alternative construction with such sensing films positioned between the poles with the short side of the rectangle adjacent the magnetic media to form what is often termed a vertical sensor or an "end-on" sensor. These kinds of sensors were both initially based on use of the anisotropic magnetoresistive effect in the sensing films. This effect gives a maximum change in magnetoresistance due to the sensed magnetic fields on the order of 2.5% at room temperature.

As data tracks in the magnetic media grow ever thinner coupled with use of higher densities of magnetization direction changes therealong, the need for a more efficient converter of such magnetization changes in the magnetic medium into a sufficiently large current or voltage output signal becomes greater. Hence, horizontal and vertical magnetoresistive sensors based on the "giant magnetoresistive effect" were introduced because of the greater changes in resistance possible from corresponding changes in externally applied magnetic fields. A vertical or end-on magnetoresistive sensor based on the "giant magnetoresistive effect" is typically formed with a nonmagnetic intermediate conductive metal layer having ferromagnetic layers on opposite sides of the major surfaces thereof with all layers in corresponding rectangular shapes. As before, such a vertical sensor is mounted typically between a pair of ferromagnetic material shielding poles in a narrow gap provided therebetween so that a short side edge of the rectangular film sensor is positioned adjacent the magnetic media approximately in a plane with the sides of the poles also being positioned adjacent the magnetic media with the resultant surface in this plane forming the air bearing surface. Thus, the long sides of the sensor extend inward into the gap between the poles and away from the magnetic media.

The magnitudes of the changes in voltage across the length of the vertical sensing "sandwich" structure due to magnetization transitions in the magnetic media passing thereby, leading to voltage pulses that combine to form the sensor output or "read" signal, will be determined by a) the magnitude of the sense current provided therethrough along this length which in turn results in a sense field, $H_{sn}$, across the width of the sensing films, and b) the magnitudes of the angular changes in the directions of the magnetizations of the two ferromagnetic layers for corresponding changes in the applied external field due to changing magnetization directions in the magnetic media passing by the sensor, i.e. the signal field or $H_{sg}$. This signal field is directed to a significant extent along the length of the vertical sensing "sandwich" because of the permeabilities and the geometries of the magnetic materials present.

The increases in magnetic flux along the length of the sensing structure, due to the corresponding rotating magnetizations of the ferromagnetic layers in response to changing applied external fields because of magnetization transistions in the magnetic media passing thereby, is proportional to the total film magnetization multiplied by $4\pi$ and further multiplied by the sine of the angle between the direction of the total magnetization and an axis parallel to the surface of the magnetic media across the width of the sensing films termed the "x" axis. Hence, the degree of angular change in the directions of the magnetizations of the ferromagnetic layers in response to an externally applied field can be characterized as an effective permeability in the sensing structure in view of its relation to the increase in lengthwise flux in response to an externally applied field. This effective permeability characterizes the sensing film in the sensing structure, and, as indicated, is proportional to the sine of the just described angle which can be designated $\theta$.

An approximate analysis for determining the value of $\theta$ can be found from thermodynamic considerations through finding the total magnetic energy present in such a vertical sensor and differentiating the same with respect to $\theta$ followed by setting the result equal to zero to determine the value of $\theta$ yielding a minimum for that energy. This is equivalent to setting equal to zero the magnetic torque on the magnetization vectors in the ferromagnetic films or layers which can be written directly assuming that the magnetization of each of the ferromagnetic layers is in the plane of the layer due to the thinness of such layers as films, and assuming that the rotations of the magnetization in each of those layers are equal in magnitude but opposite in direction because of symmetry between the layers. Further assumed is that, in each of the ferromagnetic layers, the magnetizations at the long sides of those layers in the vertical sensing films are pinned parallel to those sides due to demagnetization considerations. In these circumstances, the magnetization effect of one ferromagnetic layer on the other can be found from a line integral of the total magnetic field around the sensing "sandwich" structure intermediate layer, i.e. primarily across the width of the sensor, so that the magnetic torque equation can be written as $$\text{Magnetic torque} = 2A\frac{d^2\theta}{dx^2} + M_s(H_{sg} + H_b)\cos\theta - \frac{4\pi}{2}M_s^2 TS' \sin\theta \frac{d^2\cos\theta}{dx^2} - M_s H_{sn}\sin\theta - M_s H_k \sin\theta\cos\theta = 0.$$

Here, the quantity A is the exchange constant, $M_s$ is the saturation magnetization, and $\theta$ is the angle of the film magnetization away from the fabricated easy axis which is across the width of that sensing film in the direction of the x axis taken as having its zero datum at the center of the sensor width.

The factor S' is the effective separation of the two ferromagnetic layers in the sensing structure "sandwich". The effective separation is somewhat greater than the actual physical separation of those layers, i.e. the thickness of the intermediate layer, because of the turning of the magnetic flux in one ferromagnetic layer toward the other at the long edges of the vertical sensor so as to have that field pass through the separation to the other. The effective separation is determined from $$S' = S + \frac{2}{\alpha}\left[\frac{\cosh\left(\frac{\alpha T}{2}\right) - 1}{\alpha T \cosh\left(\frac{\alpha T}{2}\right) - \sinh\left(\frac{\alpha T}{2}\right)}\right],$$

where $$\alpha = \sqrt{\frac{4\pi M_s^2}{2A}}.$$

In addition, $H_{sg}$ is the externally applied signal field due to the changing magnetizations in the magnetic media passing by the sensor and $H_{sn}$ is the sense field due to the sense current as indicated above. $H_b$ is the bias field generated by the provision of a bias current in a current strap near the sensing structure that is used to operate the vertical sensor in a more linear portion of its characteristic. $H_k$ is the anisotropy field.

The first term on the right-hand side of the equal sign in the magnetic torque equation is an exchange term representing the resulting torque on the rotating magnetization. The second term is the torque due to the signal field generated by the changing magnetizations in the magnetic media moving past the vertical sensing structure, and the torque due to the bias field provided by a current in the bias current strap. The third term is the torque due to demagnetizing effects of the fringing fields between the ferromagnetic layers. The fourth term is the torque due to the sense field resulting from the sense current passed through the vertical sensing structure in a direction parallel to the long sides thereof. Finally, the last term is the torque due to the anisotropy described above.

This anisotropy field has a value with respect to an effective easy axis which can be arranged during fabrication of the ferromagnetic films to occur along one of many possible directions in these films. As a result, the algebraic sign of the term in the above equation containing this factor will vary depending on where this axis is located in the films actually made, and will not always be negative as shown in the above torque equation which is appropriate, as an example, for the easy axis extending across the width of the vertical sensing structure.

Some easy axis directions in the ferromagnetic films have been found to be better than others in providing a larger output signal for a given externally applied field input. One such arrangement is effectively having the easy axis extend along the length of the vertical sensing structure even though the ferromagnetic films were fabricated with an externally applied field directed along the width of the structure which would typically result in the easy axis being along the structure width or "x" axis. This moving of the effective easy axis from across the width of the vertical sensing structure to along its length comes about due to shape anisotropy effects because of its rectangular shape, exchange coupling and surface roughness coupling ("orange-peel coupling") which act to provide the effective easy axis along the length of the vertical sensor. Changing the thickness of the film will change the surface roughness coupling to a greater degree than it will change the shape anisotropy to provide some control of the result, and the composition of the ferromagnetic layers can be changed to lower the anisotropy field across the sensing structure width to provide further control. The magnitude of the resulting lengthwise effective anisotropy field is significantly less than that which would be provided if the fabricated easy axis intentionally provided during fabrication along the length of the vertical sensing structure.

The value of having an effective anisotropy field of a reduced value directed along the length of the vertical sensor can be seen from a further approximation for the magnetic torque set out in the above torque equation by neglecting the curling of the magnetic field at the long edges of the vertical sensor and neglecting the demagnetizing fields. As a result, the equation represents approximately the sensing situation occurring near the center of the width of the vertical sensor relatively far from the edges, and represents that as though this condition applied over the entire width of the sensor. In addition, the bias field can be ignored for this purpose. The result of such an approximation is $$M_s H_{sg} \cos \theta - M_s H_{sn} \sin \theta \pm M_s H_k \sin \theta \cos \theta = 0.$$

An alternative algebraic sign indication, ±, has been placed ahead of the anisotropy term to indicate that the anisotropy field term leads to opposite polarity torques depending on whether the easy axis with respect to which the field occurs is, for two possibilities, either across the width of the sensing structure or along the length of the sensing structure. As indicated, the first magnetic torque equation above was written assuming that the effective direction of the easy axis was across the sensor.

Since the response of the sensing structure to an externally applied signal field, i.e. the effective permeability, as indicated above is proportional to the sine of θ, this last equation can be solved for the sine of θ to get an expression related to the effective permeability or $$\sin\theta = \frac{H_{sg}\cos\theta}{H_{sn} \pm H_k \cos\theta} = \frac{H_{sg}}{\frac{H_{sn}}{\cos\theta} \pm H_k}.$$

In this last solution, the precedence of the denominator term $H_k$ with a plus sign corresponds to the easy access being across the width of the stripe. In this circumstance, one can see that an increase in the sense field $H_{sn}$ will in this circumstance only serve to reduce the effective permeability and hence provide little aid in increasing the output signal in response to a externally applied signal field $H_{sg}$.

In the opposite situation in which a minus sign precedes the anisotropy field $H_k$ in the last equation for a lengthwise easy axis, however, a relatively high effective permeability can be maintained even with large sense fields through adjusting the anisotropy field value to be relatively near in magnitude to the desired sense field magnitude. Thus, if the difference in magnitudes between sense field H, acting across the width of the vertical sensor in response to the sense current traversing the length of that sensor, and anisotropy field $H_k$ is kept small through adjustment of the anisotropy field value by appropriate adjustment of the combined exchange coupling, "orange-peel" coupling, and shape anisotropies, a relatively large effective permeability can be provided in the vertical sensing structure.

As indicated above, the resistance change along the length of the vertical sensor is proportional to the sign of the angle between the magnetizations in the two ferromagnetic layers on either side of the intermediate layer. The output signal is formed from the voltage changes occurring across the length of the sensing structure for a fixed sense current therethrough because of the magnetization direction transitions in the magnetic media passing by the sensor that act to change the angle between the magnetization vectors in the two ferromagnetic layers, an angular change which is related to the effective permeability as described above. Thus, the magnitude of the output signal will depend on the amount of resistive change in the sensor which in turn will depend on the fraction of the length of that sensor which is penetrated by the externally applied signal field $H_{sg}$ causing such angular changes.

The degree that the externally applied magnetic field is shunted away from the vertical sensor by the high permeability shielding poles on either side thereof in a typical "read" sensing head determines the effective fraction of, or the effective length in, the vertical sensing structure that is subject to this externally applied field. The effective signal field in the vertical sensing structure can be found from an Ampère's law line integral through the entire field over a closed path through the length of the vertical sensing structure and across the gaps and then through the length of a shielding pole positioned adjacent to the vertical sensor across the gap therefrom. Such a procedure can, through approximations, be used to arrive at a nonuniform transmission line model equation for the average signal flux distribution in the vertical sensing structure due to a magnetization transition in the magnetic media moving pass the sensor which is modeled as a flux source. The average signal flux in the vertical sensing structure is represented by $M_{av}$ which is averaged across the width of the sensor to provide the average signal flux at any point along the length of that sensor. The result is $$\mu_r TG_{ss}(z)\frac{d^2 M_{av}(z)}{dz^2} + \mu_r T\frac{dM_{av}(z)}{dz}\frac{dG_{ss}(z)}{dz} - M_{av} \pm M_b = 0$$

Here, T again is the thickness of a magnetic layer, $\mu_r$ is the average effective permeability, $G_{ss}(z)$ is the gap distance between the vertical sensing structure and one of the shielding poles, and $M_b$ is the bias flux resulting from a bias current in the bias strap provided adjacent to the vertical sensing structure. The variable "z" is the directional coordinate along the length of the sensor intersecting the "x" axis at its zero datum.

An analytical solution can be obtained to this equation with the simplifying assumption that the gap distance between the vertical sensor and the shielding poles on either side thereof is constant with a value of $G_{ss-c}$ giving a total gap for the gaps on both sides of the sensor of $G=2\ G_{ss-c}$. Although this is not often the case in practice, such an approximation allows obtaining a representative distance expression for the length of the vertical sensor which is effectively penetrated by the flux due to the externally applied signal field changes caused by the magnetization transitions in the magnetic media passing by the end of the vertical sensing structure. Such an approximation, along with ignoring the bias field magnetization in view of interest being only in the externally applied signal field decay with length in the sensing structure, yields $$\mu_r TG_{ss-c}\frac{d^2 M_{av}(z)}{dz^2} - M_{av} = 0.$$

This equation has an exponential solution for $M_{av}$ involving the base e raised to an exponent involving $-z$ divided by a characteristic length. This characteristic length is found to be $$\sqrt{\mu_r TG_{ss-c}}\ .$$

However, there are two shielding poles present in practice separated from the vertical sensor by two gaps, but also there are present two magnetic layers in the "sandwich" structure of that sensor. Thus, this characteristic length in practice will remain the same as that just given to thereby provide an effective decay length, d, in the vertical sensing structure measured from the air bearing surface at which the externally applied signal field is down by 1/e from its initial value, this length being $$d = \sqrt{\frac{\mu_r TG}{2}}.$$

Thus, the output voltage signal will depend on the effective permeability in the vertical sensor, the thickness of the magnetic layers therein and the length of the gap. There is a desire to increase the magnitude of the output signal for a given value of externally applied signal $H_{sg}$ provided by magnetization transitions in the magnetic media passing by the end of the vertical sensor, as such externally applied signals tend to become smaller as less and less magnetic material is provided for each bit in each data track because of a desire to increase the density of storage in the magnetic media. Thus, there is desired a sensor configuration which can yield an increased output signal for a given externally applied input signal without resulting in widening the vertical sensor which would limit the narrowness permitted for tracks in the magnetic media.

BRIEF SUMMARY OF THE INVENTION

The present invention provides a magnetic field sensing structure for providing at an output thereof representations of magnetic field changes provided therein from a source of such magnetic field changes having a pair of pole structures with a gap space between them with each including permeable material and each ending substantially in a common surface. A plurality of field sensing structures is positioned successively in the gap space to be supported between the pole structures with each having an end thereof substantially in the common surface. These sensing structures are formed of a plurality of magnetoresistive, anisotropic, ferromagnetic thin-film layers at least two of which are separated from one another by a nonmagnetic, electrically conductive layer positioned between them. They are electrically connected to one another adjacent the common surface, which can be through a thin resistive supported on at least one of them, and may be electrically connected to one of the pole structures. The easy axes of the ferromagnetic layers are directed along the length of the sensing structures into the gap even though being fabricated perpendicularly to be across the width of those structures.

DETAILED DESCRIPTION OF THE PREFERRED EMBODIMENTS

Magnetoresistive "read" sensing structures are made very small to be in accord with the dimensions of the data tracks in the magnetic media from which they are to sense magnetization transitions, and therefore are usually made using monolithic integrated circuit fabrication techniques along with other related thin-film fabrication techniques. Such limited sensing structure sizes and such limited track widths also limit the magnitude of the sensing structure output signal. However, because magnetoresistive sensing structures are to be used with increasingly narrow data tracks in the magnetic media passing by them, an increase in the number of such structures provided side by side is not feasible even though such a plurality of magnetoresistive sensing structures would be most conveniently provided in this manner. This follows because in that circumstance the steps performed in using monolithic integrated circuit fabrication techniques to provide the plurality of such sensing structures would be just those used to provide one such structure as they are all fabricated simultaneously.

A much more effective alternative construct for providing multiple magnetoresistive sensing structures fabricated by use of monolithic integrated circuit fabrication techniques involves the provision of a first end-on magnetoresistive sensing structure followed by providing the remainder of the plurality of such structures on top of this first one, i.e. sequentially along the data track path past the structure. That is, a wide side of each subsequent magnetoresistive sensing structure is positioned adjacent a wide side of the preceding magnetoresistive sensing structure separated by an electrical insulator except near the air bearing surface where successive magnetoresistive sensors are allowed to come into an electrical interconnection with one another. Thus, after two such sensing structures have been so provided, any further magnetoresistive sensing structures in this construct can be subsequently provided with the width thereof positioned adjacent to the width of the preceding one with the insulating layer therebetween except near the air bearing surface where each of the magnetoresistive sensors comes into electrical contact with the others. The necessity of additional fabrication steps for each sensing structure is more than offset by the compactness of the result in the track width direction.

Figure 1:
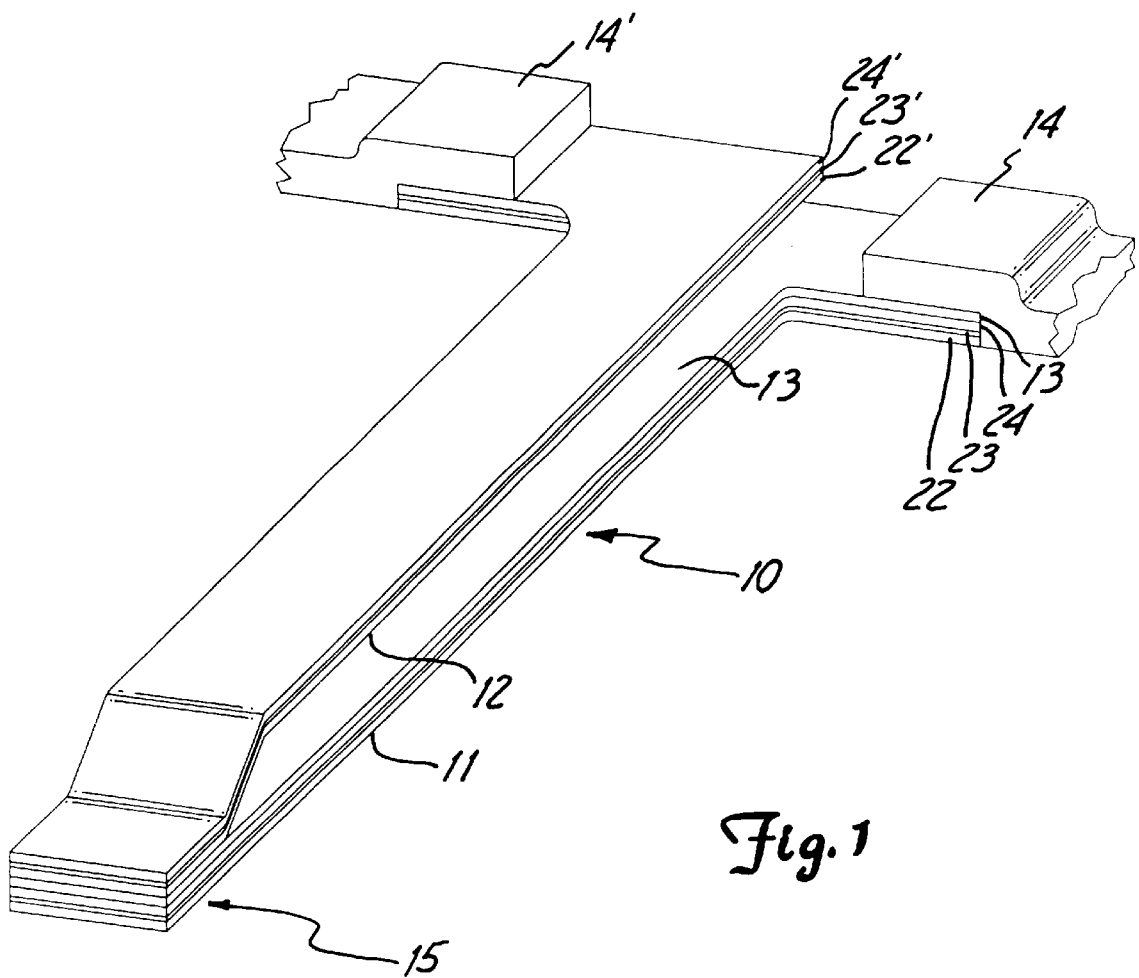
FIG. 1 shows a perspective view of a structure embodying the present invention.

FIG. 1 shows a perspective view of such a multiple magnetoresistive sensor arrangement, 10, in a situation where two such sensor structures are present. The actual sensor structural environment in which such multiple sensing structures will be provided is omitted in FIG. 1 for purposes of clarity. However, a lower sensing structure, 11, will typically be, on the lower side thereof, relatively close to a high permeability material shielding pole, and an upper sensing structure, 12, will have the top side thereof relatively close to a further high permeability material shielding pole so that sensor arrangement 10 is in a spacing gap between such shielding poles.

Lower sensing structure 11 has an electrically resistive layer, 13, on the surface thereof closest to upper sensing structure 12 that extends between these two sensing structures even at the ends thereof where they approach one another to have those ends form part of the air bearing surface of the sensor structure. Lower sensing structure 11 is contacted at the opposite, or separated, end thereof by an interconnection metal structure, 14, which is shown in part in FIG. 1. Similarly, upper sensing structure 12 is electrically interconnected by a further interconnection metal structure, 14', also shown in part in FIG. 1. The space between lower sensing structure 11 and upper sensing structure 12, except where they approach one another as occurs in a contact region, 15, shown at the left bottom of in FIG. 1, is filled with an electrical insulation material not shown in FIG. 1. Resistive layer 13 allows lower and upper sensing structures 11 and 12 to be conductively connected to one another in region 15 so that an electrical current can pass easily across this thin layer between these two structures, but with layer 13 having a sufficiently high resistivity and being sufficiently thin so as to prevent any significant current from flowing in layer 13 along the length of lower sensing structure 11. The presence of resistive layer 13 between lower and upper sensing structures 11 and 12 magnetically decouples them from one another so that magnetizations of the ferromagnetic layers in each can rotate independently from those in the other structure.

The use of two sensing structures 11 and 12, effectively shorted together at one end of each, in place of either one of them alone will result in a provided sense current flowing through two decay lengths rather than one which would be the situation if just a single sensing structure were used. Thus, this arrangement results in twice the voltage change across the two sensing structures in response to an externally applied magnetic field at the ends of these structures at the air bearing surface in joined region 15 compared to the voltage change that would occur across a single sensing structure. Thus, there will be at least twice the output signal from sensor arrangement 10 as there would be from either one of sensing structures 11 and 12 alone.

However, an even greater output signal gain is available from sensing arrangement 10. Since sensing arrangement 10 shown in FIG. 1 has upper sensing structure 12 and lower sensing structure 11 more or less symmetrically positioned with respect to the shielding poles used in the actual sensor structure, the ferromagnetic materials present in lower and upper sensing structures 11 and 12 are all effective in aiding the retention of magnetic flux in those structures resulting from applied external magnetic fields at the air bearing surface to thereby help in reducing the shunting away of that flux by the shielding poles. As a result, the effective thickness of the ferromagnetic layers in the above expression for the decay length doubles in value with the use of sensing arrangement 10 over use of a single sensing structure thus increasing the effective delay length by a factor $\sqrt{2}$. Hence the addition of a second sensing structure in sensor arrangement 10 results in an increase in the output signal ($2\sqrt{2}$ in the case of two sensing structures) which is an increase that is more than proportional to the total number of sensing structures provided assuming substantially identical structures.

The shorting of lower sensing structure 11 to upper sensing structure 12 in region 15 through letting the sensors come into electrical contact through resistive layer 13 in this region results in effectively connecting these two sensors electrically in a series circuit with one another. This, in effect, is the same result one would get from making either of sensors 11 or 12 twice as long and folding half of the result back along, and adjacent to, the first half. Hence, sensor arrangement 10 of FIG. 1 can be termed a "folded" sensing arrangement or, in actual use, a folded sensor.

Sensing arrangement 10 of FIG. 1 is typically positioned between two shielding poles of ferromagnetic material in providing a "read" head sensor for the sensing of those magnetization transitions passing by the air bearing surface end of that sensor. The material or materials used for these poles are highly permeable in the pertinent frequency range based on the rate of magnetic transitions to be encountered in the passing magnetic media. A fragment of such a sensor is shown in a cross section view in the layer diagram of FIG. 2. Such a sensor is fabricated using monolithic integrated circuit fabrication techniques, but starting such a sensing structure on a permeable material substrate rather than on a semiconductor substrate or necessarily an electrically insulative substrate.

Figure 2:
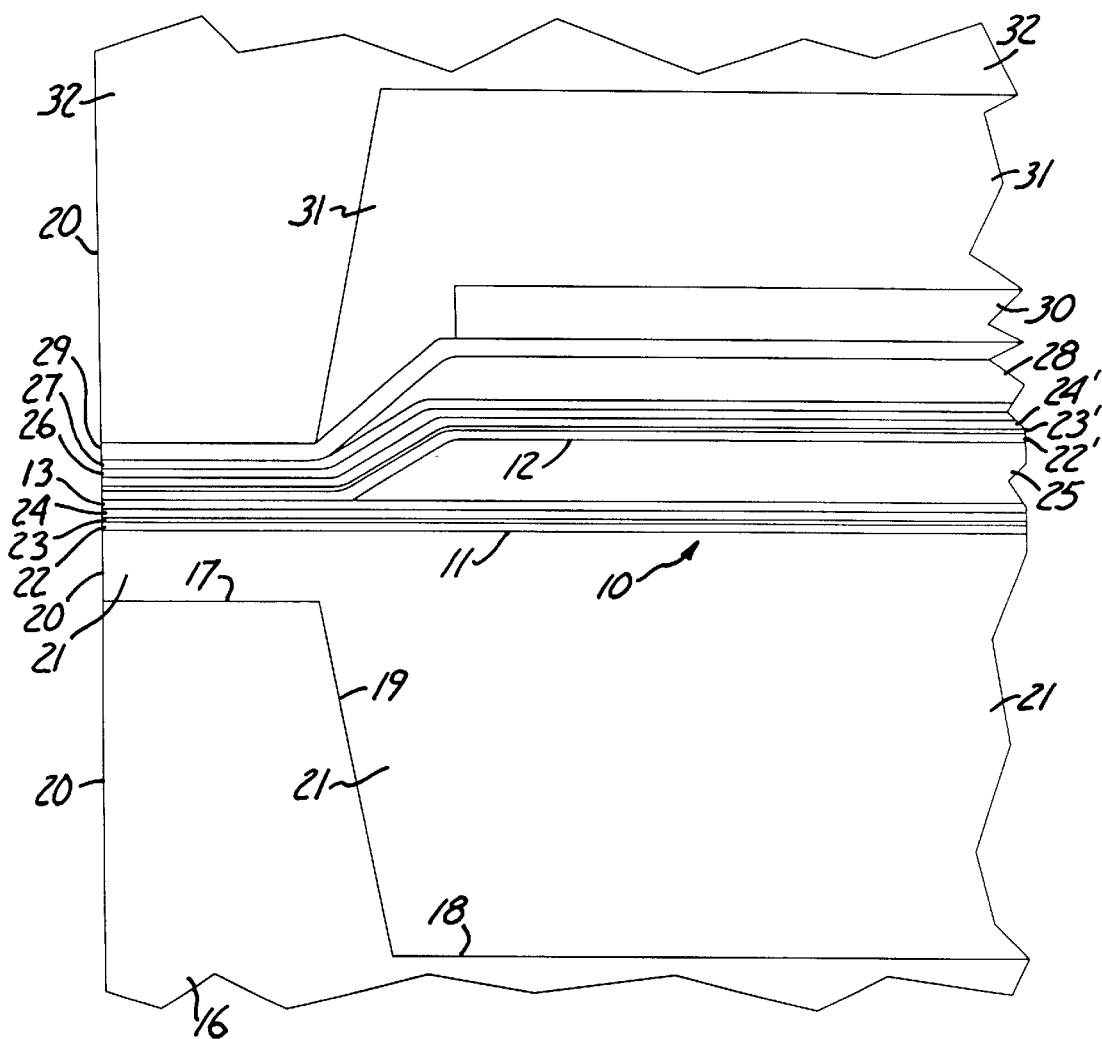
FIG. 2 shows a cross section view of a fragment of a structure embodying the invention of FIG. 1, and FIGS. 3A and 3B show cross section views of an alternative structure embodying the invention of FIG. 1.

Thus, typically, a highly permeable material substrate of several microns of thickness is initially provided which, for a shielding pole which is leading with respect to the passing magnetic media, i.e. the lower pole in FIG. 2, should be of a relatively hard permeable material to prevent contacts with media surface asperities from resulting in pole metal being worn away and then deposited across the air bearing surface of the sensor to result at some point in an electrical short circuit developing between the trailing shielding pole and sensing arrangement 10. Typically, that material would be formed from iron alloyed with 10% or so of silicon and several percent of aluminum (in some forms known as Sendust). Such a shielding pole may be provided by plating or by sputter depositing it on a further suitable substrate.

The exposed surface of the shielding pole material deposition is then polished using chemical and mechanical polishing techniques to provide a smooth surface. Ion milling techniques are next used to provide a recess below this polished surface except near an intersecting vertical side surface intended to be part of the air bearing surface to thereby provide for a narrow gap between the shielding pole and the sensor near the air bearing surface but a wider gap therebetween further from that surface. A resulting lower shielding pole, 16, is shown in part in the fragmented cross-section view for a portion of a "read" sensing head in FIG. 2 having a narrow gap surface, 17, extending about 0.25 μm inward from the air bearing surface side on the left to be joined to a wide gap surface, 18, by a slanted side surface, 19, which have been formed by the ion milling. Narrow gap surface 17 of shielding pole 16 is also intersected in that pole by part of an air bearing surface, 20, shown as a vertical line on the left in FIG. 2 of which a portion is formed by the vertical intersecting left side of pole 16.

An electrical insulating gap material is then provided over narrow gap surface 17, slant surface 19 and wide gap surface 18 as a filler to form a further substrate potion for sensing arrangement 10 to be formed upon. Again, a relatively hard material is desired to be used in the narrow gap location over surface 17 where the material will have a side surface forming part of air bearing surface 20. Thus, a lower gap filling insulator, 21, is provided which can be of aluminum oxide deposited through sputter deposition to a thickness which is on the order of 1500 Å above narrow gap surface 17 but extending approximately 1.0 μm above surface 18. Because the deposition of aluminum oxide is relatively slow, gap filling material 21 can be provided in two parts beginning with providing silicon nitride on surface 18 and surface 19 up to the level of surface 17, and thereafter providing aluminum oxide over surface 17 and the exposed surface of the silicon nitride to again a thickness of 1500 Å over surface 17. Lower gap electrical insulator 21 has the exposed surface thereof again polished using chemical and mechanical techniques to form a smooth surface upon which to provide sensor arrangement 10.

Lower sensing structure 11 is then provided on the upper exposed polished surface of gap filling material 21. Typically, a succession of sputtered layers is provided for this structure including a two strata first magnetic layer, 22, with the first stratum being of a softer ferromagnetic material as a kind of Permalloy having a composition of 65% nickel, 15% iron, and 20% cobalt deposited to a thickness of 45 Å followed by a second stratum of a harder ferromagnetic material having a greater magnetic saturation to provide an enhanced "giant magnetoresistive effect". This second stratum is formed of 95% cobalt and 5% iron and deposited to a thickness of 15 Å. Both of these strata are deposited in the presence of a magnetic field directed either into or out of the plane of FIG. 2. A following conductive but nonmagnetic layer of copper, 23, is then deposited to a thickness of 28 Å, on which a second two strata ferromagnetic layer, 24, is deposited in the same manner having a structure that is substantially the same as that of the first two strata ferromagnetic layer, but with the strata provided in reverse order so that the higher magnetic saturation layer is again against copper layer 23 as part of providing the enhanced "giant magnetoresistive effect".

Finally, a high resistivity layer that is sufficiently thinned to prevent significant current flow along its length but also to provide good conductivity across its thickness is provided on layer 24 as interconnection layer 13, this material chosen to be chrome-silicon of 400 Å thickness. This layer also serves as an etch stop in the subsequent ion milling step used to provide the succession of deposited layers for lower sensing structure 11 in the desired shape therefor which is typically that shown in FIG. 1. Standard methods are used to provide the patterning for this purpose based on known masking, etching and ion milling steps to expose layer 21 where lower sensing structure 11 is not to be present. Lower sensing structure 11 is shown in FIG. 2 with its constituent layers numbered as given above for the originally deposited layers. FIG. 2 is, as indicated above, a layer diagram giving an indication of the structural layers described herein forming the sensor, but it is not a true cross-section view because many of the dimensions of the structures therein are exaggerated or reduced for purposes of clarity.

Silicon nitride is then deposited on layer 13 to a thickness of 1000 Å as the basis for a spacer, 25, between most of sensing structures 11 and 12. Silicon nitride layer 25 is first masked and opened over the end of lower sensing structure 11 away from the narrow gap region above narrow gap surface 17 to expose layer 13 on that end of structure 11 using well known steps. A first layer of interconnection metal, aluminum alloyed with 4% copper, is then sputter deposited to a thickness of 0.5 micron over layer 25 and the opening therein so as to also be over that exposed portion of layer 13 occurring at the end of lower sensor 11 to thereby make electrical contact therewith. This first metal layer is masked and etched by standard methods to form a first metal layer interconnection structure which includes interconnection 14 shown in FIG. 1 (though not in FIG. 2), This silicon nitride layer is then covered with photoresist which is patterned in such a way as to have an opening over the opposite end of lower sensing structure 11 located over narrow gap surface 17 in a well known step. Silicon nitride layer 25 is then opened a second time using this photoresist mask over narrow gap surface 17 in a standard manner to expose layer 13 in that area using standard masking and etching techniques. Spacer layer 25, as it results from these steps, will separate lower sensing structure 11 from upper sensing structure 12, as indicated above, except in the narrow gap region above narrow gap surface 17 after the subsequent formation of upper sensing structure 12.

Upper sensing structure 12 is then formed over this exposed portion of layer 13 and over the remaining portion of spacer layer 25 in the same manner as was lower sensing structure 11. Thus, upper sensing structure 12 has its pair of two strata ferromagnetic thin-films and its intermediate copper layer designated by the same numbers as were used for similar layers in lower sensing structure 11 but with an added prime symbol, i.e. 22', 23' and 24'. In addition, a layer, 26, of tantalum, is provided on layer 24' as a oxidation barrier, and a further layer, 27, of chrome-silicon is provided on tantalum layer 26 to be used as an etch stop in the subsequent masking, etching and ion milling steps to be used to form upper sensor 12 in the shape desired therefore which is typically that shown in FIG. 1. Tantalum layer 26 is typically provided to a thickness of 200 Å, and a chrome-silicon layer 27 is typically provided to the thickness of 300 Å. The performance of these masking, etching and ion milling steps results in completing upper sensing structure 12 by exposing surface 21 where this structure is not wanted, and with this structure being separated from lower sensing structure 11 by spacer 25 except where upper sensing structure 12 comes into contact with layer 13 on lower sensing structure 11 in joined region 15 near air bearing surface 20.

A further silicon nitride layer, 28, is deposited to a thickness of 1000 Å over layer 27, and is masked and etched to provide an opening exposing layer 27 over the narrow gap region above narrow gap surface 17 in FIG. 2 in standard steps. A further aluminum oxide layer, 29, is then deposited to a thickness of 500 Å over layer 28, over the exposed portion of layer 27 in the narrow gap region above narrow surface 17, and over the exposed portions of layer 21 supporting lower and upper sensing structures 11 and 12. Since layer 29 will have an end in the narrow gap region which is part of air bearing surface 20, aluminum oxide is chosen rather silicon nitride because of its greater hardness.

Using standard masking and etching techniques, layers 29 and 28 are opened to expose the end of upper sensing structure 12 away from the narrow gap region. A second layer of interconnection metal, a composite layer with an upper strata of titanium alloyed with tungsten in equal measure is provided over an adhesion strata of gold having a 200 Å thickness to thereby provide corrosion resistance against oxygen, is sputter deposited to a 0.5 micron total thickness to permit interconnection to upper sensing structure 12, and to provide a current strap immediately over sensing arrangement 10. Standard masking and etching techniques are used to provide the resulting second metal layer interconnection structure, including interconnection 14' shown in FIG. 1 but not in FIG. 2, and to provide a current strap, 30, on layer 29 shown in FIG. 2 only. Current strap 30 will be used to carry a bias current to bias lower and upper sensing structures 11 and 12 to an operating point suitable for performing their sensing functions.

Silicon nitride is then deposited in a well known manner as a second gap filler layer, 31, over current strap 30 and over the exposed portions of layer 29. Standard masking and etching techniques are used to remove portions of gap filler 31 so as to expose layer 29 over the narrow gap region above narrow gap surface 17. Thereafter, a second shielding pole, 32, is plated or deposited of a high permeability material such as Permalloy to complete the sensor structure in FIG. 2.

Figure 3A:
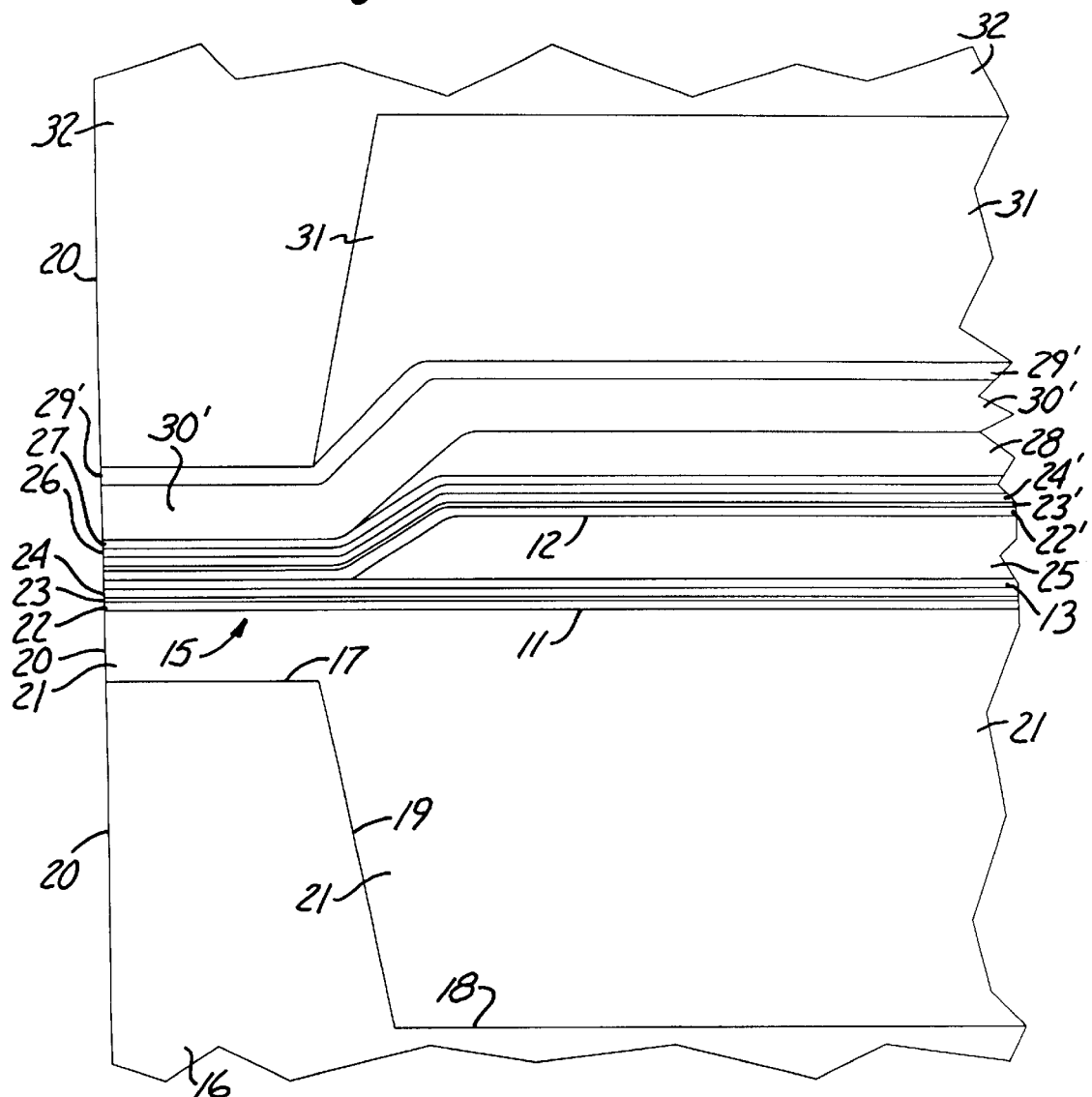
Figure 3B:

FIGS. 3A and 3B show a alternative arrangement for a "read" sensor head using sensing arrangement 10 of FIG. 1 which has the current strap for the bias current electrically interconnected with sensor structure 10 in the narrow gap region to permit the sense current through structure 10 to also pass through the current strap to do double duty, that is, to also be the bias current in addition to the sense current used with the sensor. FIG. 3A is a layer diagram showing a cross-section view of a fragment of such a "read" sensor head, and FIG. 3B is a layer diagram of a fragment of this same head but viewed from the air bearing surface thereof, i.e. viewing a portion of the leftmost surface represented in FIG. 3A. The structure shown in FIGS. 3A and 3B retain the same numerical designation used for similar structures in FIGS. 1 and 2 with the addition of a prime mark to indicate some change from FIG. 2.

Thus, the current strap to carry the bias current is redesignated in FIG. 3A as 30', and the deposition metal for this strap is supported on silicon nitride layer 28, and on the exposed surface of chrome-silicon layer 27 in the narrow gap region above narrow gap surface 17 insofar as seen in FIG. 3A, because of having been deposited and patterned prior to providing any aluminum oxide over upper sensing structure 12. In further contrast to the structure shown in FIG. 2, aluminum oxide layer 29' is now supported on current strap 30' by having been subsequently deposited and patterned after the formation of that strap.

As to be seen in FIG. 3B, current strap 30' is supported on chrome-silicon layer 27, as indicated above in connection with FIG. 3A, but, past that layer to the left in that figure, current strap 30' is also supported on the surface of gap filler 21 where not covered by sensor arrangement 10. Furthermore, aluminum oxide layer 29' has been opened during fabrication after its formation using standard masking and etching techniques to allow top shielding pole 32 to come into contact with current strap 30' at the far left in FIG. 3B thereby completing the electrical contact provided by current strap 30' between sensor arrangement 10 near the air bearing surface and top shielding pole 32 also near the air bearing surface. Because current strap 30' will be part of air bearing surface 20 in this configuration, a metal different from aluminum alloyed with copper may be chosen for this strap which is harder such as a gold and tungsten alloy.

In this arrangement, sense current entering either of terminals 14 and 14' in FIG. 1 can be conducted down the length of the corresponding ones of sensing structures 11 and 12 to reach current strap 30' near the air bearing surface in the narrow gap region at location 15 where structures 11 and 12 are electrically connected together, and then conducted through current strap 30' while maintaining joined region 15 at approximately the ground voltage value present on top shielding pole 32. A pair of amplifiers, or an adder amplifier that adds signal values on inputs thereof, can be connected from corresponding ones of interconnection terminals 14 and 14' to the ground reference voltage present at top shielding pole 32 to sense the voltage drop across corresponding ones of sensors 11 and 12. These voltage drops can be added together in either of these amplifier arrangements to provide the output signal for the sensor. A single amplifier can be used in the structure of FIG. 2 connected between terminals 14 and 14' to obtain the voltage drop across the entire sensor without the need to perform a signal addition in the amplifier arrangement.

Although the present invention has been described with reference to preferred embodiments, workers skilled in the art will recognize that changes may be made in form and detail without departing from the spirit and scope of the invention.

What is claimed is:

1. A magnetic field sensing structure for providing at an output thereof representations of magnetic field changes provided therein from a source of such magnetic field changes, said sensing structure comprising:

a pair of pole structures spaced apart from one another to form a gap space therebetween each comprising a permeable material and each having an end thereof substantially in a common surface; and a plurality of field sensor structures supported in said gap space so as to be positioned successively between said pole structures to each have an end thereof substantially in said common surface, each of said plurality of field sensor structures being formed of a plurality of magnetoresistive, anisotropic, ferromagnetic thin-film layers at least two of which are separated from one another by a nonmagnetic layer positioned therebetween, and each of said plurality of field sensor structures being electrically connected to one another adjacent said common surface.

2. The sensing structure of claim 1 wherein each of said plurality of field sensor structures is electrically connected to another positioned adjacent thereto through a resistive separating layer.

3. The sensing structure of claim 1 wherein each of said plurality of field sensor structures is electrically connected to another positioned adjacent thereto and to one of said pair of pole structures.

4. The sensing structure of claim 1 wherein each of said plurality field sensor structures has said ferromagnetic thin-film layers therein deposited in the presence of a magnetic field substantially parallel to that said end thereof in said common surface but has an easy axis therein following fabrication that is directed substantially perpendicular to that said end thereof in said common surface.

5. The sensing structure of claim 1 wherein said pair of pole structures are closely spaced with respect to one another where said plurality of field sensor structures are electrically connected to one another adjacent said common surface but are comparatively more distantly spaced apart from one another elsewhere along said plurality of field sensing structures.

6. The sensing structure of claim 1 wherein said plurality of field sensor structures each have a portion thereof at a location thereon that is spaced apart from said common surface which extends at least in part in a direction opposite that direction of extent of a portion of any other said field sensor structure adjacent thereto.

7. A magnetic field sensing structure for providing at an output thereof representations of magnetic field changes provided therein from a source of such magnetic field changes, said sensing structure comprising:

a first field sensor structure positioned to each have an end thereof substantially in a common surface; and a second field sensor structure positioned to each have an end thereof substantially in said common surface, each of said first and second field sensor structures being formed of a plurality of magnetoresistive, anisotropic, ferromagnetic thin-film layers at least two of which are separated from one another by a nonmagnetic layer positioned therebetween, and said first and second field sensor structures being electrically connected to one another adjacent said common surface.

8. The sensing structure of claim 7 wherein each of said plurality of field sensor structures is electrically connected to another positioned adjacent thereto through a resistive separating layer.

9. The sensing structure of claim 7 wherein each of said plurality field sensor structures has said ferromagnetic thin-film layers therein deposited in the presence of a magnetic field substantially parallel to that said end thereof in said common surface but has an easy axis therein following fabrication that is directed substantially perpendicular to that said end thereof in said common surface.

10. The sensing structure of claim 7 wherein said pair of pole structures are closely spaced with respect to one another where said plurality of field sensor structures are electrically connected to one another adjacent said common surface but are comparatively more distantly spaced 11. The sensing structure of claim 7 wherein said plurality of field sensor structures each have a portion thereof at a location thereon that is spaced apart from said common surface which extends at least in part in a direction opposite that direction of extent of a portion of any other said field sensor structure adjacent thereto.

\* \* \* \* \*